US011009626B2

(12) United States Patent
Said

(10) Patent No.: US 11,009,626 B2
(45) Date of Patent: May 18, 2021

(54) EMPIRICAL DETERMINATION OF VLF ATTENUATION FACTORS

(71) Applicant: Vaisala, Inc., Louisville, CO (US)

(72) Inventor: Ryan K. Said, Broomfield, CO (US)

(73) Assignee: Vaisala, Inc., Louisville, CO (US)

( * ) Notice: Subject to any disclaimer, the term of this patent is extended or adjusted under 35 U.S.C. 154(b) by 410 days.

(21) Appl. No.: 16/214,804

(22) Filed: Dec. 10, 2018

(65) Prior Publication Data

US 2020/0183049 A1 Jun. 11, 2020

(51) Int. Cl.
*G01W 1/16* (2006.01)
*G01W 1/18* (2006.01)

(52) U.S. Cl.
CPC ............... *G01W 1/16* (2013.01); *G01W 1/18* (2013.01)

(58) Field of Classification Search
CPC .......... G01W 1/16; G01W 1/18; G01R 35/00; G01R 29/0842
See application file for complete search history.

(56) References Cited

U.S. PATENT DOCUMENTS

| 4,914,444 A | 4/1990 | Pifer et al. | |
|---|---|---|---|
| 2003/0151398 A1* | 8/2003 | Murphy | G01R 29/0842 324/72 |
| 2009/0281730 A1* | 11/2009 | Said | G01W 1/16 702/4 |

(Continued)

FOREIGN PATENT DOCUMENTS

| EP | 1611446 A2 | 1/2006 |
|---|---|---|
| JP | 2006194643 A | 7/2006 |

(Continued)

OTHER PUBLICATIONS

Brian S Burkholder, Michael L Hutchins, Michael P McCarthy, Robert F. Pfaff, and Robert H Holzworth. Attenuation of lightning-produced sferics in the earth-ionosphere waveguide and low-latitude ionosphere. Journal of Geophysical Research: Space Physics, 118(6):3692-3699, 2013. 8pgs.

(Continued)

*Primary Examiner* — Natalie Huls
*Assistant Examiner* — Michael J Singletary
(74) *Attorney, Agent, or Firm* — Maschoff Brennan; Paul G. Johnson

(57) ABSTRACT

A method includes detecting, by a pair sensors located at two locations, a radio wave generated from a lightning discharge occurring; for the pair of sensors, determining propagation paths between the discharge and sensors; repeating the same with a second pair of sensors and another lightning discharge; for each path, determine path vectors defined by an attenuation coefficient vector; constructing a matrix with each row comprising the difference between path vectors from sensor pair measurements from the lightning discharge and including a selection entry based on the identification of the sensors to enable the logarithm of sensor calibration factors to be solved for; constructing another vector, where each entry comprises the difference between the logarithms of the sensor amplitudes from a sensor pair measurement adjusted by a logarithm of an offset; inverting a system of linear equations defined by the matrix to solve for attenuation and sensor calibration factors.

20 Claims, 6 Drawing Sheets

(56) References Cited

U.S. PATENT DOCUMENTS

2016/0018563 A1* 1/2016 Candor ............... G01W 1/16 324/72

FOREIGN PATENT DOCUMENTS

WO        03/069375 A2     8/2003
WO    2004/086067 A2   10/2004

OTHER PUBLICATIONS

Kenneth L Cummins, Martin J Murphy, Edward A Bardo, William L Hiscox, Richard B Pyle, and Alburt E Pifer. A combined toa/mdf technology upgrade of the us national lightning detection network. Journal of Geophysical Research: Atmospheres, 103(D8):9035-9044, 1998. 10pgs.

K Davies. Ionospheric radio, 580 pp. Peter Peregrinus Ltd, London, 1990. 487 pgs.

JA Ferguson. Computer programs for assessment of long-wavelength radio communications, version 2.0: User's guide and source files. Technical report, Space and Naval Warfare Systems Center San Diego CA, 1998. 57 pgs.

Michael L Hutchins, Robert H Holzworth, Craig J Rodger, and James B Brundell. Far-field power of lightning strokes as measured by the world wide lightning location network. Journal of Atmospheric and Oceanic technology, 29 (8):1102-1110, 2012. 9 pgs.

ML Hutchins, Abram R Jacobson, Robert H Holzworth, and James B Brundell. Azimuthal dependence of vlf propagation. Journal of Geophysical Research: Space Physics, 118(9):5808-5812, 2013. 5 pgs.

Vincent P Idone, Arsalan B Saljoughy, Ronald W Henderson, Paul K Moore, and Richard B Pyle. A reexamination of the peak current calibration of the national lightning detection network. Journal of Geophysical Research: Atmospheres, 98(D10):18323-18332, 1993. 10 pgs.

Richard E Orville. Calibration of a magnetic direction finding network using measured triggered lightning return stroke peak currents. Journal of Geophysical Research: Atmospheres, 96(D9):11135-17142, 1991. 8 pgs.

Antti T Pessi, Steven Businger, KL Cummins, NWS Demetriades, M Murphy, and B Pifer. Development of a long-range lightning detection network for the pacific: Construction, calibration, and performance. Journal of Atmospheric and Oceanic Technology, 26(2):145-166, 2009. 22 pgs.

RK Said, MB Cohen, and US Inan. Highly intense lightning over the oceans: Estimated peak currents from global gld360 observations. Journal of Geophysical Research: Atmospheres, 118(13):6905-6915, 2013. 11 pgs.

RK Said, US Inan, and KL Cummins. Long-range lightning geolocation using a vlf radio atmospheric waveform bank. Journal of Geophysical Research: Atmospheres, 115(D23108), 2010. 19 pgs.

Rajeev Thottappillil and Martin A Uman. Comparison of lightning return-stroke models. Journal of Geophysical Research: Atmospheres, 98(D12):22903-22914, 1993. 13 pgs.

Martin A Uman, D Kenneth McLain, and E Philip Krider. The electromagnetic radiation from a finite antenna. American Journal of Physics, 43(1):33-38, 1975. 6 pgs.

James R Wait and Kenneth P Spies. Characteristics of the Earth-ionosphere waveguide for VLF radio waves. No. 300. US Dept. of Commerce, National Bureau of Standards: for sale by the Supt. of Doc.,US Govt. Print. Off., 1964. 110 pgs.

Cummer, et al., "Modeling ELF radio atmospheric propagation and extracting lightning currents from ELF observations", Radio Science, American Geophysical Union, Washington, DC, US, vol. 35, No. 2, Mar. 1, 2000 pp. 385-394.

Extended European Search Report and Opinion, European Application No. 19207583.6, dated May 6, 2020.

* cited by examiner

EMPIRICAL DETERMINATION OF VLF ATTENUATION FACTORS

FIELD

Embodiments discussed in the present disclosure are related to empirical determination of very low frequency (VLF) attenuation factors in the Earth-ionosphere waveguide for global lightning location systems.

BACKGROUND

Terrestrial-based lightning detection, location, and measurements made on a global scale are determined by measuring radio waves from lightning discharges. In some cases, radio waves having frequencies of approximately 50 kilohertz or less (although other frequency bands are considered) may have reflected off of the Earth's ionosphere and may be redirected towards the Earth in what is known as subionospheric propagation.

This background is only provided to illustrate one example technology area where some embodiments described herein may be practiced.

SUMMARY OF THE DISCLOSURE

Systems and methods are disclosed for empirical determination of very low frequency attenuation factors in the Earth-ionosphere waveguide for global lightning location systems. Although very low frequency attenuation is described, the systems and methods described herein may apply to other frequency ranges and are not limited to very low frequency.

In some embodiments, a computer-implemented method for empirical determination of very low frequency (VLF) attenuation factors in the Earth-ionosphere waveguide for global lightning location systems, at least a portion of the method being performed by a monitoring computer device, the method including detecting, by a first pair of two sensors located at two locations, a first radio wave generated from a first lightning discharge, the first lightning discharge occurring at a first discharge location; for the first pair of sensors, determining a respective first and second corresponding propagation path between the first lightning discharge and each of the first pair of sensors; detecting, by a second pair of two sensors located at two locations, a second radio wave generated from a second lightning discharge, the second lightning discharge occurring at a second discharge location; for the second pair of sensors, determining a respective third and fourth corresponding propagation path between the second lightning discharge and each of the second pair of sensors; for each of the first, second, third, and fourth propagation paths, determining a corresponding path vector defined by the attenuation coefficient vector such that a plurality of path vectors are determined in aggregate; constructing a matrix, where each row of the matrix comprises the difference between path vectors corresponding to one of the first or second sensor pair measurements from the first or second lightning discharge, where each row in the matrix further includes at least one selection entry based on the identification of each of the two sensors in the pair to enable the logarithm of a plurality of sensor calibration factors to be solved for; constructing a corresponding vector, where each entry of the corresponding vector comprises the difference between the logarithms of the sensor amplitudes from a sensor pair measurement, where logarithms of the sensor amplitudes are further adjusted by a logarithm of a pre-determined offset; inverting a system of linear equations defined by the matrix and the corresponding vector to solve for a set of attenuation factors that define the attenuation coefficient vector and the plurality of sensor calibration factors; and operating a global lightning network using the set of attenuation factors and sensor calibration factors.

In an additional or alternative embodiment, the pre-determined offset is a range dependent offset. In an additional or alternative embodiment, the attenuation coefficient vector comprises a set of factors that influence attenuation of the first or second radio wave. In an additional or alternative embodiment, the set of factors are defined in terms of an amount of attenuation in decibels.

In an additional or alternative embodiment, the set of factors is expressed in terms of attenuation per unit of propagation distance of a portion of a whole of the first, second, third, or fourth propagation path where each of the set of factors is relevant. In an additional or alternative embodiment, the set of factors is expressed as a constant attenuation factor applied to a whole of at least one of the first, second, third, or fourth propagation paths.

In an additional or alternative embodiment, the set of factors that influence attenuation of the radio wave include a time of day, a location, a direction of propagation of the radio wave with respect to the Earth's magnetic field, an inclination of the Earth's magnetic field, ground conductivity, an ionospheric reflection number and reflection angle, distance between the first or second discharge location and one of the sensors of the first pair or second pair of sensors, elevation of the sun during the daytime, day and night terminator crossings, land and sea crossings, or a combination thereof.

In an additional or alternative embodiment, each of the plurality of path vectors is based on the radio wave propagating through the Earth-ionosphere waveguide.

In an additional or alternative embodiment, operating the global lightning network may further include calculating a peak-current amplitude of the lightning discharge based on one or more range-normalized signal strengths (RNSSs).

In an additional or alternative embodiment, during operation of the global lightning network, the method may further include determining a range-normalized signal strength (RNSS), measured in dB, for each sensor of the first sensor pair and the second sensor pair, wherein determining the RNSS is based on a sum of the logarithm of the sensor amplitude, the logarithm of the sensor calibration factor, the logarithm of the offset factor, and an additional attenuation factor.

In an additional or alternative embodiment, the additional attenuation factor may be based on the path vector defined by the attenuation coefficient vector, where the entries in the path vector and the attenuation coefficient vector are multiplied and summed.

In an additional or alternative embodiment, determining each of the first, second, third, or fourth propagation path vectors further includes determining the great-circle path from the discharge location to each of the plurality of sensors.

In an additional or alternative embodiment, determining each of the first, second, third, or fourth propagation path vectors further includes determining each entry into each of the path vectors based on the definition of the attenuation coefficient vector.

In an additional or alternative embodiment, the first radio wave and the second radio wave have a frequency in a range inclusive of 3 to 30 kilohertz (kHz).

In an additional or alternative embodiment, the first lightning discharge and the second lightning discharge being the same lightning discharge.

In an additional or alternative embodiment, a lightning detection system may include a plurality of lightning detection sensors; a processor, a memory in electronic communication with the processor, and instructions stored in the memory, the instructions being executable by the processor to perform a method for empirical determination of VLF attenuation factors.

In an additional or alternative embodiment, one or more non-transitory computer-readable media may include one or more computer-readable instructions that, when executed by one or more computing devices, cause the one or more computing devices to perform a method for empirical determination of VLF attenuation factors.

These example embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1:
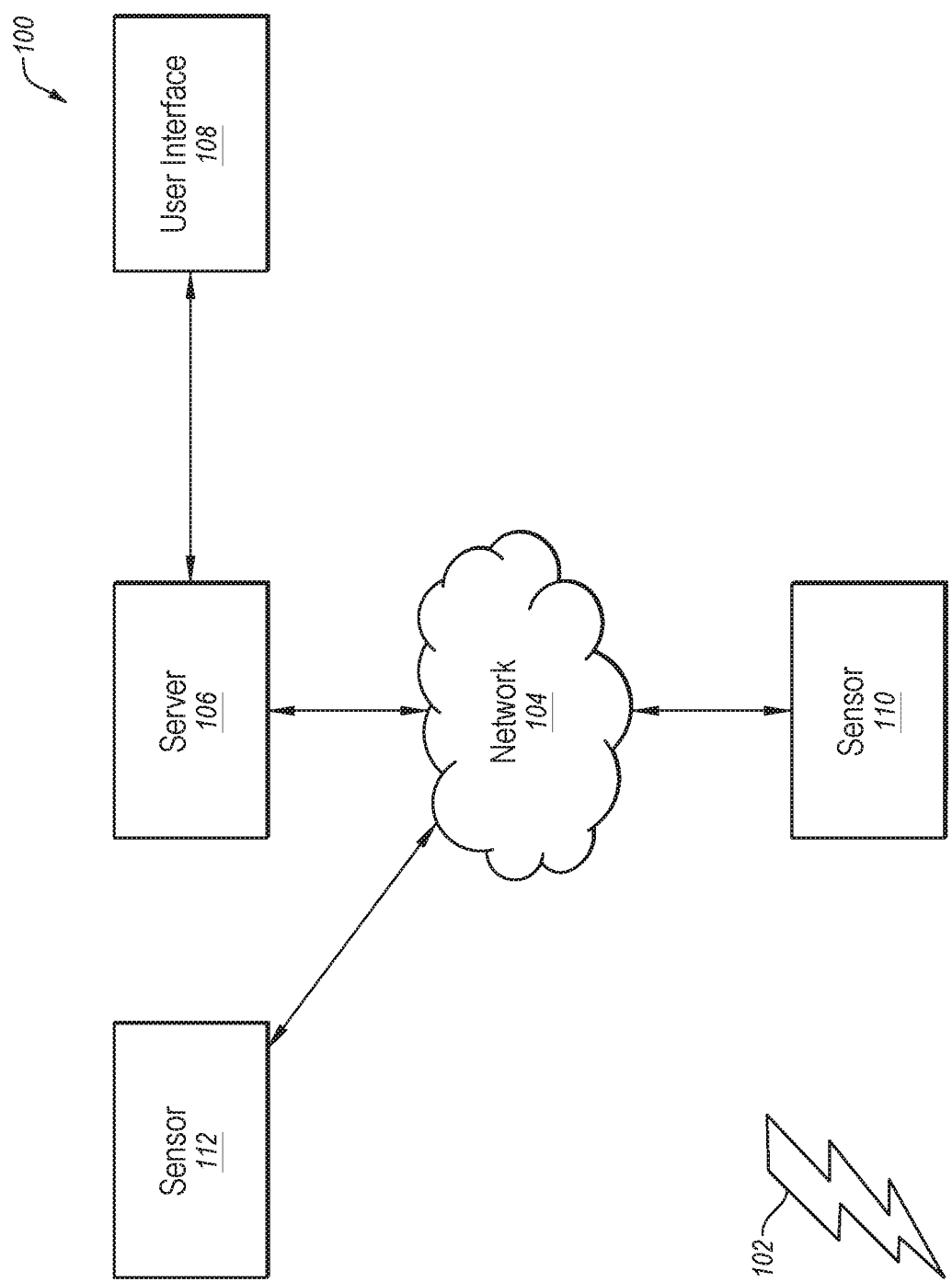
FIG. 1 is an example lightning location system to empirically determine VLF attenuation factors in the Earth-ionosphere waveguide.

Lightning discharges are characterized by powerful current processes that either lower charge to the ground or partially neutralize charge separation within or between clouds. Some ground-based lightning locating systems (LLSs) may measure radio waves from these current processes at multiple sensors to geolocate the source discharge (i.e., lightning discharge).

Lightning discharges that generate significant radiation in the Very Low Frequency (3-30 kHz) and Low Frequency (30-300 kHz) ranges may be categorized as cloud-to-ground (CG) strokes or cloud pulses, where a CG stroke is a lightning discharge that connects a charge region in a cloud to the ground, and where a cloud pulse may be a lightning discharge that connects regions with opposite polarity within one cloud or between multiple clouds. For CG return strokes, theoretical models and empirical validation experiments have shown that the peak of the channel-base current (in kiloamps) is approximately proportional to the peak amplitude (measured using either the vertical electric or a horizontal magnetic field) of the radiated impulse if measured by a broadband VLF/LF sensor. An operational VLF/LF sensor may measure frequency less than or equal to about 500 kHz. In addition, broadband VLF measurements, typically less than about 50 kHz, of radio waves from CG return strokes have a strongly linear relationship with the amplitudes returned by a VLF/LF sensor.

Thus, ground-based LLSs operating either in the VLF/LF or VLF ranges can use sensor amplitude measurements, together with an empirically-derived conversion factor, to estimate the channel-base current for CG strokes. Typically, these systems use the same conversion factor to report effective peak current amplitude measurements for inter- and intra-cloud (IC) pulses.

Accurate estimates of peak current amplitudes in CG strokes are relevant to many commercial, industrial, and safety applications. The peak current magnitude determines the voltage spike to resistive objects struck by a lightning discharge. A large voltage transient on the phase conductor of a transmission line, for example, can cause a short-circuit fault, interrupting operations of the line. In addition, in some embodiments, peak current amplitude and polarity may be key input features to a classifier that distinguishes CG return strokes from IC pulses.

Peak current measurements are determined by a ground-based VLF/LF or VLF LLS by measuring the peak radio wave amplitude from lightning discharges at multiple sensors at various locations. As the radio waves propagate from the lightning discharge to each respective sensor, the amplitude of the radio waves attenuate from the source (i.e., the discharge) to the receiver (i.e., the sensor). Because multiple sensors are at varying distances from the lightning discharge, the amplitude of the radio waves radiating from the lightning discharge is measured as having potentially varying amplitudes depending on which sensors receive the radio waves. For example, if a sensor is located 100 kilometers (km) from the source location, the amplitude of the radio wave at the sensor is going to be larger than if the sensor is located 200 km from the source location in the same direction.

At each sensor, the measured received amplitude may be determined, and one or more amplitude propagation correction factors may be applied to convert the measured amplitude at the sensor to an amplitude at a standard reference distance from the lightning source. This amplitude correction process generates a Range-Normalized Signal Strength (RNSS). The resulting RNSS is then converted to an estimated peak current through an empirical conversion factor. In one embodiment used in prior art, the standard propagation distance for RNSS calculations is 100 km.

The same attenuation model used to convert sensor amplitudes to RNSS is also a key component to accurately model a network's detection efficiency—the percent of lightning flashes in a given region detected by the network. Thus, in addition to improving an LLS's ability to provide accurate peak current amplitude estimates, in at least one embodiment, the methods detailed here can be used to improve a model of the network's detection efficiency.

One implementation of the RNSS calculation, used in operational VLF/LF networks, may be represented by Equation (1) as follows:

$$A_{RNSS} = C \times A_{SS} \times \left(\frac{d}{I_0}\right)^p \times \exp\left(\frac{d - I_0}{L}\right)$$

where $A_{SS}$ is the signal strength measured at the remote sensor, d is the propagation distance from the lightning source to the sensor, $I_0$ is the standard distance reference for the RNSS, p is a power factor (usually close to 1) applied to the distance to account for the rate of geometric spreading over an ever-increasing radius, L is an e-folding distance determining the exponential attenuation rate due to a finitely conducting earth, C is a constant calibration factor, and $A_{RNSS}$ is the calculated RNSS. The peak current is then determined from the RNSS through an empirically-determined conversion function.

The above formulation has been used in VLF/LF networks where each sensor can reliably detect the ground wave, which is the radio wave that diffracts over the surface of the earth from the source to the sensor. Thus, the attenuation factors depend only on the ground conductivity profile along the propagation path. The methods detailed here can help refine the attenuation model used by VLF/LF networks that reliably detect the ground wave.

In some embodiments, however, an LLS relies on detecting radio waves that have propagated a significant distance in the Earth-ionosphere waveguide, where the Earth-ionosphere waveguide is bounded by the Earth on the lower end and by the ionosphere on the upper end. The ionosphere is the ionized portion of the Earth's upper atmosphere located from approximately 60 km to 1,000 km in altitude. The ionosphere is composed of plasma (i.e., positive ions and free flowing electrons), which is sustained by ionizing radiation from solar radiation during the day and cosmic rays during the night. Extremely low frequency (ELF) signals (300 Hz-3 kHz) and VLF signals can propagate efficiently within the Earth-ionosphere waveguide, since the ionosphere acts as an efficient reflector at ELF and VLF frequencies.

Thus, lightning detection done on a global scale may be accomplished by measuring radio waves having a frequency below approximately 50 kHz that have reflected off of the ionosphere and have been redirected towards the Earth (i.e., subionospheric propagation in the Earth-ionosphere waveguide). Long-range VLF networks that rely on ionospheric reflections can leverage this efficient propagation to monitor and locate lightning discharges across large geographic areas with relatively few sensors. However, ionospheric reflections also greatly complicate the amplitude attenuation profile versus distance. Thus, the attenuation formulation presented herein to calculate the range-normalized signal strength can encompass multiple variables that influence Earth-ionosphere attenuation profiles, including, but not limited to, the distance between the source and the sensor, time of day (e.g., nighttime versus day time), geomagnetic latitude, ground conductivity indexed by ground type (e.g., saltwater versus ground), direction of travel relative to Earth's magnetic field (e.g., eastward versus westward), ionospheric reflection number and reflection angle, etc.

In at least one embodiment, a numerical model exists to model radio propagation in the Earth-ionosphere waveguide. This model, called the Long Wavelength Propagation Capability (LWPC), simulates radio wave propagation at single frequencies in the Earth-ionosphere waveguide. This model has been adapted to model attenuation of broadband radio waves from lightning by running the model over several frequency bands. Given the complexity of the Earth-ionosphere waveguide, and dependence on the attenuation profile with time of day, location, and direction, in principle a new model run is required for each source-sensor path. LWPC has been used to estimate attenuation profiles in an operational global LLS, where look-up attenuation tables generated from LWPC runs are used to correct for attenuation profiles in the Earth-ionosphere waveguide.

Using the LWPC model to correct for attenuation has drawbacks. Using the LWPC model may require making assumptions that the model may be extended to broadband signals, which may be done by averaging multiple single-frequency model runs over the bandwidth of the sensor observations, as well as making assumptions that the model includes all necessary factors. Additionally, the LWPC model only accounts for attenuation between the source and the sensor. Additional effort must be made to determine a sensor's amplitude calibration factor, which can depend on local site effects from the sensor's surroundings and/or hardware calibration factors. The method described here simultaneously addresses both the attenuation profiles and the calibration factor at each sensor.

Reference will now be made to the drawings to describe various aspects of some example embodiments of the disclosure. The drawings are diagrammatic and schematic representations of such example embodiments, and are not limiting of the present disclosure, nor are they necessarily drawn to scale.

FIG. 1 is an example lightning detection system 100 (hereinafter "system 100") used to empirically determine VLF attenuation factors in the Earth-ionosphere waveguide, arranged in accordance with at least one embodiment described herein. In general, the system 100 may include two or more lightning detection sensors 110 and 112 (hereinafter "sensors"). While two lightning detection sensors 110 and 112 are shown in FIG. 1, the system 100 is not limited to two sensors; more generally, the system 100 may include any suitable number of lightning detection sensors.

The system 100 may also include a network 104, a server 106, and/or one or more user interface devices 108. Although illustrated as discrete blocks, various blocks may be divided into additional blocks, combined into fewer blocks, or eliminated, depending on the desired implementation.

Each of the sensors 110 and 112 may include any type of Earth-based lightning detection sensor such as a VAISALA LS7002 lightning detection sensor or any other suitable lightning detection sensor. In some embodiments, one or more of the sensors 110 and 112 may include an Earth-based lightning detection sensor, such as Earth-based lightning detection sensor 200 of FIG. 2. In these and other embodiments, one or more of the sensors 110 and 112 may include one or more components of the Earth-based lightning detection sensor 200 of FIG. 2.

The sensors 110 and 112 may be distributed throughout an environmental space to generate Earth-based lightning data about one or more lightning sources 102 within the environmental space. In some embodiments, for example, the sensors 110 and 112 may generate the Earth-based lightning data about the lightning source 102 within the environmental space. A single lightning source 102 is depicted in FIG. 1 for simplicity, however, many more lightning sources are contemplated.

Each lightning source 102 may include a discharge with movement of charge in the Earth's atmosphere or between the atmosphere and Earth, and which generates or emits electromagnetic radiation (EMR) emissions that may be detected by the sensors 110 and 112. The EMR emissions may include radio frequency (RF) emissions. RF emissions may generally include EMR emissions with a frequency somewhere in a range from about 500 hertz (Hz) to about 300 gigahertz (GHz). RF emissions from a lightning source may be referred to as lightning pulses.

In some embodiments, the sensors 110 and 112 may detect low frequency lightning pulses emitted by the lightning sources 102; for example, the sensors 110 and 112 may detect the lightning pulses at frequencies between 1 kHz and 400 kHz. Additionally or alternatively, the sensors 110 and 112 may detect the lightning pulses at frequencies equal to or less than 30 kHz (e.g., VLF). Additionally or alternatively, the Earth-based lightning detection sensors 110 and 112 may detect the lightning pulses at frequencies equal to or greater than 400 kHz (e.g., medium frequency (MF)).

In some embodiments, one or more of the sensors 110 and 112 may detect time domain, low frequency lightning pulses that may have (and/or whose data may have), for example, a specific shape, a specific time of arrival, a specific amplitude, and/or a specific direction of arrival from the one or more lightning sources 102.

In some embodiments, the sensors 110 and 112 may generate the Earth-based lightning data for detected lightning pulses. The Earth-based lightning data, for example, may include time-varying voltage or other time-varying measurements of the detected lightning pulses, times of occurrence of the lightning pulses, durations of the lightning pulses, the timing of when the lightning pulses are detected at each sensor, the magnitude of the lightning pulses, the polarity of the lightning pulses, the type of lightning pulses, global positioning system (GPS) data associated with the Earth-based lightning detection sensors 110 and 112, angle or direction of arrival data, the time of day of arrival (e.g., daytime or nighttime), data from which one or more of the foregoing may be determined or derived, or other Earth-based lightning data.

In some embodiments, the sensors 110 and 112 may detect lightning sources 102 and/or lightning pulses emitted by the lightning sources 102 at long ranges such as, for example, ranges greater than 500 km, 1000 km, 1500 km, 1750 km, etc.

In some embodiments, the sensors 110 and 112 may provide geolocation capabilities to the server 106 via the network 104, that specify the geolocation of the respective sensors 110 and 112.

In some embodiments, the network 104 may communicatively connect the sensors 110 and 112 to the server 106. In some embodiments, the network 104 may be a wireless network that includes one or more wireless networks, such as a wireless local area network (LAN), a cellular network, a long-term evolution (LTE) network, a code division multiple access (CDMA) network, a global system for mobile communication (GSM) network, a microwave network, a long range Wi-Fi network, a satellite network, or other suitable network. In some embodiments, the network 104 may include a wired LAN or Ethernet connection, or other wired connections for serial or parallel data transmission from the sensors 110 and 112 to the server 106. In some embodiments, the network 104 may include both wireless and wired components; for example, the Earth-based lightning detection sensors 110 and 112 and the server 106 may be communicatively coupled to the network 104 via one or more wired connections.

Figure 5:
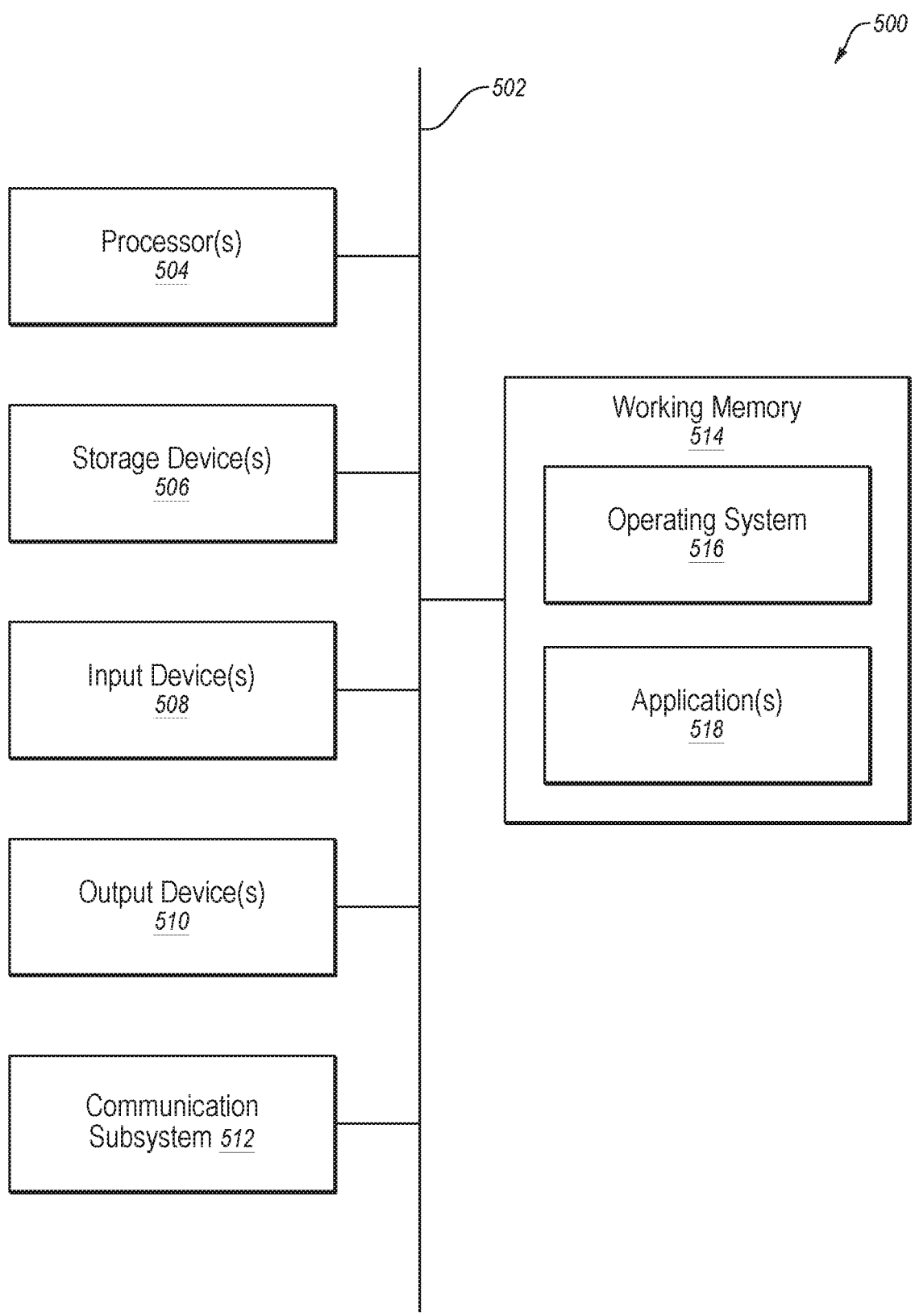
FIG. 5 shows an example computational system, all arranged in accordance with at least one embodiment described herein.

In some embodiments, the server 106 may include one or more components of a computational system 500 of FIG. 5. In some embodiments, the server 104 may include one or more servers located in one or more locations. In some embodiments, the server 106 may receive the lightning data from all or some of the sensors 110 and 112 via the network 104. In some embodiments, the server 106 may include a database where the lightning data received from the sensors 110 and 112 may be stored.

In some embodiments, the server 106 may include a processor (or one or more processors) programmed to process and/or analyze the Earth-based lightning data received from the sensors 110 and 112 and/or stored in the database of the server 106.

In some embodiments, the server 106 may geolocate (e.g., determine a position of) the lightning sources 102, or locations of origin of the corresponding lightning pulses, based on the lightning data received from the sensors 110 and 112. For example, the server 106 may be configured to determine a position of the lightning source 102 (e.g., using a time difference of arrival (TDOA) based on GPS-synchronized timing, or triangulation based on arrival angle data, or a combination of the two methods, based on timing, angle, and other waveform field data included in the lightning data received from the sensors 110 and 112). Such methods may consider the time of arrival of the same lightning pulse emitted by the lightning source 102 at the two (or more) sensors 110 and 112, locations, and/or angle/direction data.

In some embodiments, the user interface device 108 may include any device that can access data stored at the server 106 such as a computer, a laptop, a smartphone, a tablet, or other suitable device. In some embodiments, the user interface device 108 may be used to retrieve and/or present the lightning data from sensors 110 and 112 and/or other measurements and information related to the lightning sources 102.

Figure 2:
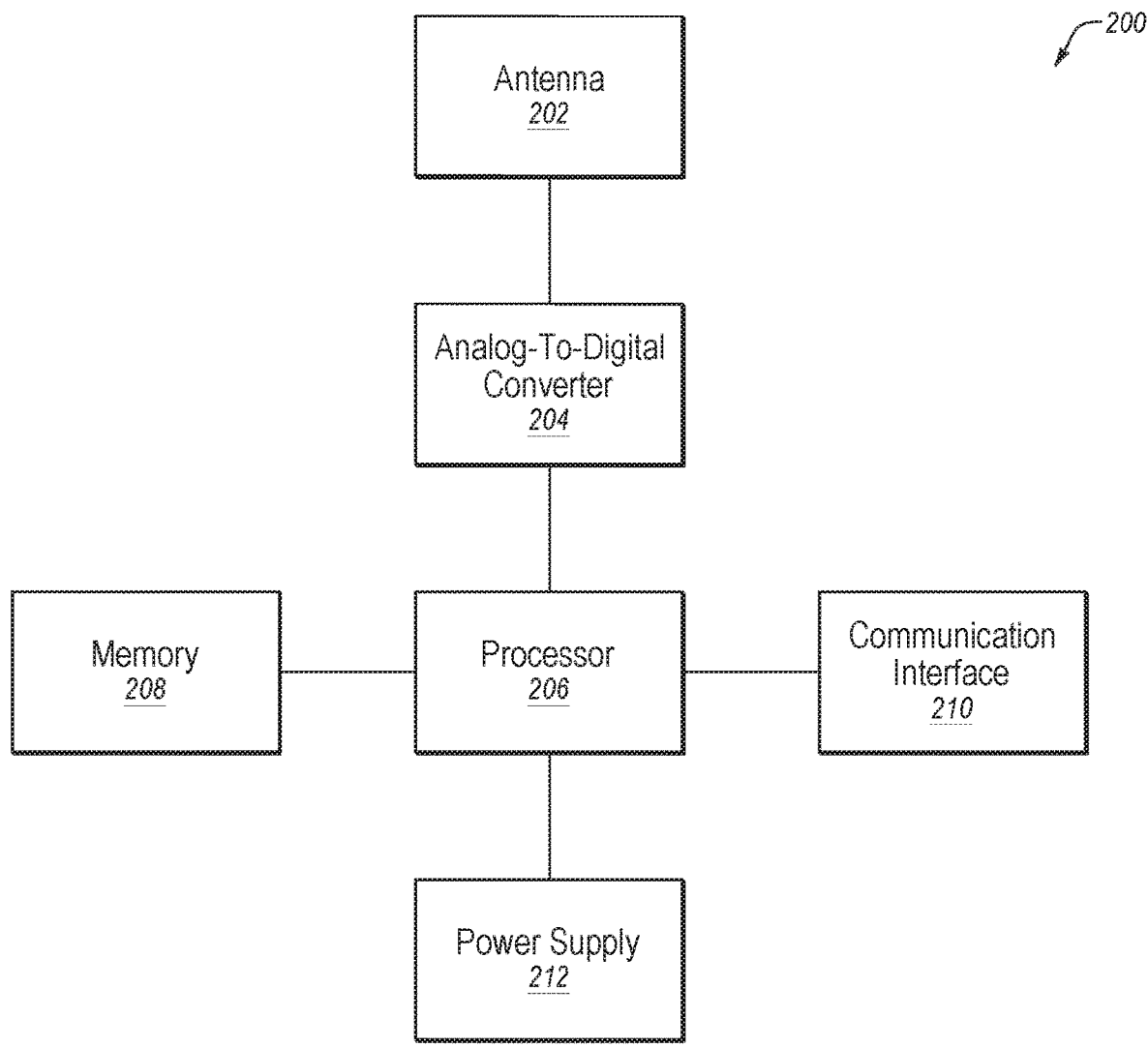
FIG. 2 is an example Earth-based lightning detection sensor to empirically determine VLF attenuation factors in the Earth-ionosphere waveguide.

FIG. 2 is an example Earth-based lightning detection sensor 200 (hereinafter "sensor 200"), arranged in accordance with at least one embodiment described herein. The sensor 200 may include or correspond to one or more of the sensors 110 and/or 112 of FIG. 1. In at least one embodiment, the sensor 200 may include an antenna 202, an analog-to-digital converter (ADC) 204, a processor 206, a memory 208, a communication interface 210, and/or a power supply 212. Various other components may also be included.

In some embodiments, the sensor 200 may, for example, detect lightning pulses emitted by lightning discharges in an environmental space and/or may measure different characteristics of the lightning-generated radio wave pulses. For example, the sensor 200 may receive and detect, at the antenna 202, lightning-generated radio wave pulses spanning one or more of LF, VLF, and/or ELF and may include frequencies in the range of 30 kHz to 300 kHz. VLF may include frequencies in the range of 3 kHz to 30 kHz. ELF may include frequencies in the range of 0.3 kHz to 3 kHz. In other embodiments, the sensor 200 may receive and detect, at the antenna 202, lightning generated radio wave pulses at other frequencies instead of or in addition to the foregoing range of detection frequencies. For instance, the detection frequencies may extend at least partially into MF (300 kHz to 3 MHz). The antenna 202 may detect either the vertical electric field, or it may be comprised of two orthogonally oriented magnetic field antennas to detect the horizontal magnetic field. The antenna 202 may output, for each detected lightning pulse, an analog signal that represents the lightning pulse.

In some embodiments, the processor 206 may include one or more components of the computational system 500. In some embodiments, the processor 206 may include one or more servers located in one or more locations and/or located at various distributed locations. In one embodiment, processing to extract waveform data may be done locally at any of the sensors described, where the waveform data may be transmitted to a different computing system for further analysis and/or collection, for example, to processor 206.

Thus, some processing may be performed remotely, e.g., at the server 106 of FIG. 1. The processor 206 may more generally include any suitable processing device, such as a processor, a microprocessor, a controller, a microcontroller, a field programmable gate array (FPGA), an application specific integrated circuit (ASIC), a digital signal processor (DSP), or other suitable processing device.

In some embodiments, the ADC 204 may convert the received analog signal for each lightning-generated radio wave pulse into a digital signal or digital data. The digital signal or digital data may include a digital representation of the lightning pulse. The digital signal or digital data, for example, may be stored by the processor 206 in the memory 208. The digital signal or digital data, for example, may be communicated to an external device, such as the server 106, via the communication interface 210, as lightning data.

In some embodiments, the processor 206 may include one or more components of the computational system 500. In some embodiments, the processor 206 may include one or more servers located in one or more locations and/or located at various distributed locations. The processing may be performed remotely, e.g., at the server 106 of FIG. 1. The processor 206 may more generally include any suitable processing device, such as a processor, a microprocessor, a controller, a microcontroller, a field programmable gate array (FPGA), an application specific integrated circuit (ASIC), a digital signal processor (DSP), or other suitable processing device.

In some embodiments, the memory 208 may include a disk drive, a drive array, an optical storage device, a solid-state storage device, such as random access memory ("RAM") and/or read-only memory ("ROM"), which can be programmable, flash-updateable, and/or the like.

In some embodiments, the communication interface 210 may include a modem, a network card (wireless or wired), an infrared communication device, a wireless communication device, and/or a wireless communication chipset. In some embodiments, the communication interface 210 may communicate with a wireless network such as a wireless LAN, a cellular network, a LTE network, a CDMA network, a GSM network, a microwave network, a long range Wi-Fi network, a satellite network, or other suitable network. The communication interface 210 may transmit data, such as lightning data, to the server 106 (or another device) via the network 135 (or other network).

In some embodiments, the sensor 200 may be mounted on a concrete ground pad, while in other embodiments, the sensor 200 may also include non-ground mounting options. The sensor 200 may be used to perform and/or control operation of one or more of the methods or operations of the embodiments described herein. For example, the sensor 200 may be used to make any measurement, perform any calculation, solve any equation, perform any identification, and/or make any determination described herein.

In some embodiments, the sensor 200 may include either a power supply 212, which may be a DC power supply or an AC power supply.

In at least one embodiment, the methods described herein enable the ability to use empirically derived VLF attenuation profiles in the Earth-ionosphere waveguide to calculate RNSSs in a global network. The methods described here additionally enable derivation of empirical attenuation factors and sensor calibration factors without having to assume details about the ionospheric profile and without having to use a reference dataset.

The following describes a framework for using empirically derived attenuation factors in the Earth-ionosphere waveguide to calculate RNSSs. This description is followed by a description of a method to use a large collection lightning location solutions, with the associated sensor data, to empirically determine the attenuation factors.

In the case of ground-wave propagation, an amplitude measured from a received signal at a sensor may be translated to a range-normalized signal strength $A_{RNSS}$. To estimate the range-normalized signal strength (RNSS) for each source, a range-normalization function may be used to compensate for the attenuation that occurs as the radio waves generated by the lightning source 102 attenuate from the location of the source 102 to each sensor. Equation (1) describes such a function, which accounts for geometric spreading, and an exponential attenuation with distance.

Taking the logarithm of each side of the equality in Equation (1) converts the equation from a series of multiplications to a series of additions. Also, the exponential term is converted to a linear function in terms of distance. By combining constant factors, it can be shown that Equation (1) can be equivalently expressed as Equation (2) below:

$$\tilde{A}_{RNSS} = \tilde{A}_{SS} + \tilde{I}_g(d) + C_0 + C_1 d$$

where $\tilde{A}_{SS}$ is the logarithm of the signal strength, $\tilde{I}_g(d)$ is the logarithm of the geometric spreading factor $$\left(\frac{d}{I_0}\right)^p,$$

and $C_0$ and $C_1$ are constant factors. Note that the e-folding distance L is incorporated into $C_1$.

Equation (2) may be expanded to include additional attenuation factors beyond the single factor $C_1$ by replacing the last term with a dot-product between a vector of attenuation factors $\overline{C}$ and a path vector $\overline{F}$ defined by the specific source-sensor path. The range-normalization function may thus be represented by Equation (3) below:

$$\tilde{A}_{RNSS_i} = (\tilde{A}_{SS_i} + \tilde{I}_g(d_i)) + C_{0,i} + \overline{C} \cdot \overline{F}(\theta_i)$$

where $\tilde{A}_{SS_i}$ is the logarithm of the sensor signal strength; $\tilde{I}_g(d_i)$ is the logarithm of the geometric spreading, expressed as a function of distance between the source and sensor i; $C_{0,i}$ is a constant factor, which includes a constant calibration factor for sensor i; $\overline{C}$ is a vector of attenuation factors (which is constant during operation); and $\overline{F}(\theta_i)$ is a path vector that is specific to the path $\theta_i$ between the source 102 and the receiving sensor i (eg sensor 110). The dot product of $\overline{C} \cdot \overline{F}(\theta_i)$ determines the non-geometric propagation losses used to calculate the RNSS for a single sensor observation.

Any number of arbitrary attenuation factors may be introduced; for example, in one embodiment, the coefficient vector $\overline{C}$ may be a 1-element vector, equal to an average exponential loss (e.g., in units dB/km). In this embodiment, $\overline{F}(\theta_i)=d$, where d may be thus be measured in kilometers. This embodiment may be analogous to the single e-folding attenuation factor described in Equation (1). In another embodiment, the coefficient vector $\overline{C}$ may be expanded to include multiple categories of, for example, ground conductivity over sea water, dry ground, and ice, each category of which is known to have a different attenuation for VLF radio waves. In this example embodiment, $\overline{F}(\theta_i)$ is equal to the total length of path $\theta_i$ spent in each of the categories of salt water, dry ground and ice, and $\overline{C} \cdot \overline{F}(\theta_i)$ represents the total exponential attenuation due to losses from finite ground conductivity over this path.

The entries in the attenuation vector $\overline{C}$ are not limited to the example units of dB/km, and other units may be contemplated. In another embodiment, for example, an entry may account for the penalty incurred crossing the day/night terminator, with units in dB. In this example embodiment, the corresponding entry in $\overline{F}(\theta_i)$ may be 1 if the path crosses the day/night terminator and 0 otherwise.

Attenuation factors may include factors that account for differential losses along the propagation path with dependencies on the geomagnetic latitude, direction of propagation with respect to the local magnetic field orientation, daytime (including sun angle) and nighttime, ionospheric reflection angles and reflection numbers, and additional constant penalties incurred crossing the day/night terminator. Additionally, attenuation factors may be contemplated and the methods are not limited to the factors described herein. For example, location-indexed factors that are tied to a specific pixel on a gridded earth may be contemplated.

Figure 3:
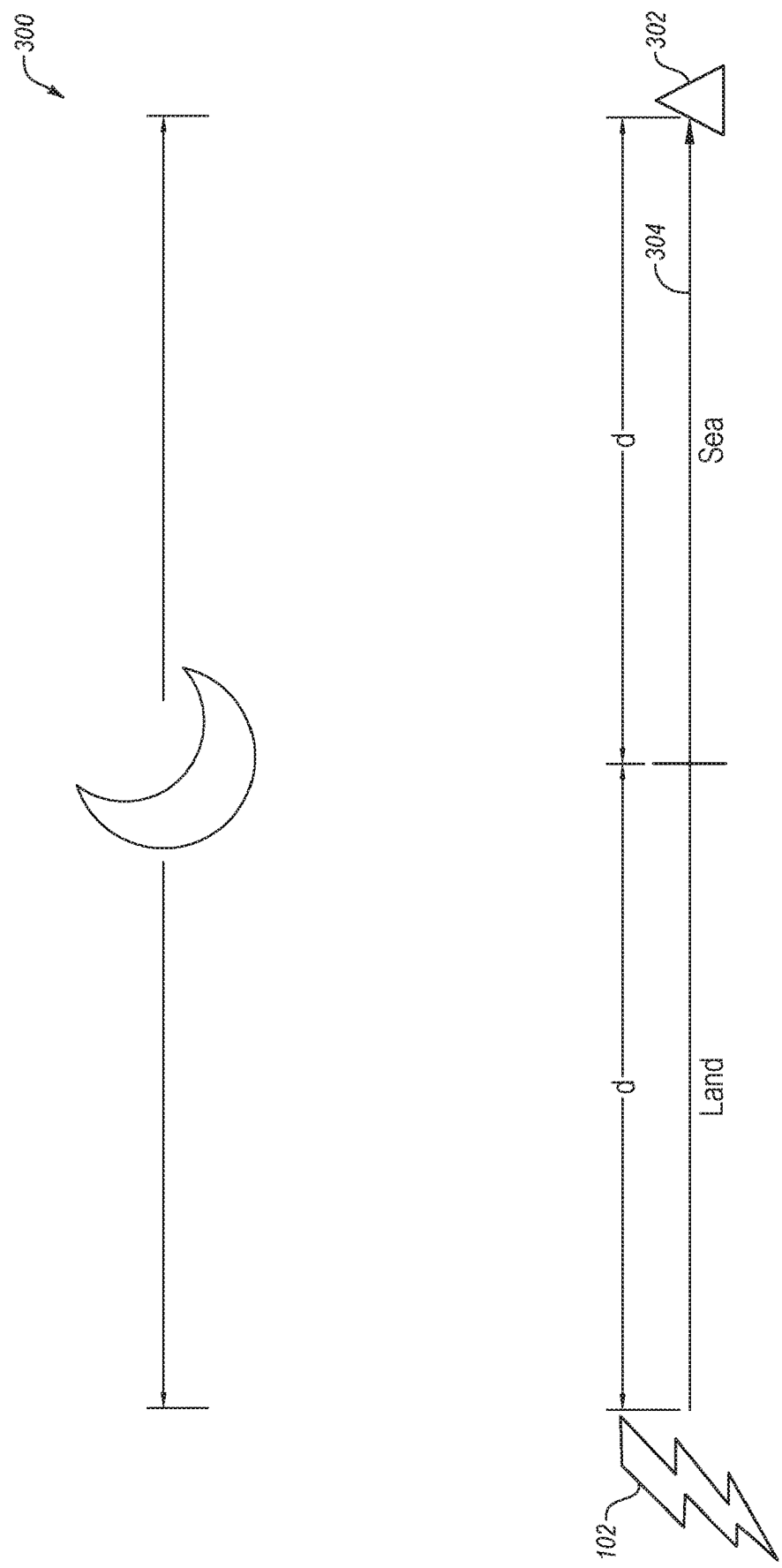
FIG. 3 is an example environment in which embodiments of empirical determination of VLF attenuation factors in the Earth-ionosphere waveguide may be implemented.

FIG. 3 is an example geographic environment 300 in which embodiments of empirical determination of VLF attenuation factors in the Earth-ionosphere waveguide may be implemented. Geographic environment 300 may have a lightning source 102 and a sensor 302. Sensor 302 may be one or any of sensors 110, 112, and/or 200 described with reference to FIGS. 1 and 2. Radio waves emitted from lighting source 102 travel to sensor 302 over propagation path 304.

In this example, there are four parameterized attenuation coefficients, each expressed in terms of dB/km: Land/ocean attenuation, and day/night attenuation. Thus, attenuation vector $\overline{C}$ may be expressed as $\overline{C}=[C_{land}, C_{sea}, C_{day}, C_{night}]^T$. An example single source-sensor propagation path is shown. In this example, the propagation path 304 covers a distance d over land, a distance d over sea, and the entire path is under a nighttime ionosphere. Thus, the path vector $\overline{F}(\theta)$ may be expressed as $\overline{F}(\theta)=[d, d, 0, 2d]^T$. Assuming d is expressed in km, the total exponential attenuation factor (in dB) for this path is $C_{land}d+C_{sea}d+C_{night}2d$. Contrasting with the single attenuation factor case described by Equation (1), where the equivalent expression would have been $C_1d$, this new formulation distributes the attenuation coefficients across multiple parameterized propagation path factors. The source 102 sensor 110 pair describes a single path vector $\overline{F}(\theta)$.

The geometric spreading equation, also referred to as spreading loss, may account for signal attenuation due to radio wave propagation in all directions from the source. As the radio waves move away from the lightning source 102, the area over which the radio wave covers increases and the intensity of the radio wave diminishes, resulting in geometric spreading. For example, a point source that generates a wave that is free to propagate in all directions experiences an amplitude loss proportional to 1/d; that is, the power at a distance d is inversely proportional to the square of the distance. In this case the geometric spreading factor applied to the signal strength as part of the conversion to a RNSS would be proportional to the distance d.

The geometric spreading term $$\left(\frac{d}{l_0}\right)^p$$

presented with respect to Equation (1) compensates for geometric spreading over a distance d. Other geometric spreading factors may be considered based on the geometric environment; for example, in a spherical waveguide, an often-used factor is proportional to $\sqrt{d/R_0 \sin(d/R_0)}$, where $R_0$ is equal to the radius of the earth. In some embodiments, the geometric spreading factor may additionally include an average assumed exponential loss, or other distance-dependent or constant offset factors.

When the LLS is in operation, the attenuation factors used to determine the RNSS are pre-determined "offline," and remain constant throughout the operation of the network. The LLS may thus use the pre-determined attenuation factors, along with the individual path vectors (considering the path from the source to each sensor), to determine the RNSS for each sensor observation once the source is geo-located. An averaged RNSS may be calculated from all contributing sensor observations, which is then used to estimate the channel-base peak current magnitude.

The following describes how the attenuation factor coefficients $\overline{C}$ and sensor calibration factors $\{C_{0i}\}$ may be calculated from a collection of network solutions. This calculation may be run at arbitrary intervals, assuming enough data are collected to make a reliable inversion possible.

The calculation of the attenuation coefficients $\overline{C}$ and sensor calibration factors $\{C_{0i}\}$ involves an inversion based on a large collection of source-sensor path pairs. During operation of the LLS, the location of the source 102 may be determined using arrival times and arrival angles at individual sensors, such as sensor 302. Once the location of the source 102 is known, then the path vector $\overline{F}(\theta_i)$ from the source 102 to each contributing sensor i is also known.

Using the inversion, the entries in $\overline{C}$ in Equation (3) and $\{C_{0i}\}$ for each sensor i may be calculated. Given a located solution, the path and therefore path vector are known, as is the sensor's signal strength. Given a distance d, the geometric spreading factor, or more broadly, a distance-dependent offset, may be also assumed. Since the attenuation and sensor calibration factors are unknown, however, the RNSS is not yet known. Thus, if N equations are stacked from N source-sensor paths, an additional unknown, $\tilde{A}_{RNSS_i}$, may be introduced for each equation.

Sensor observation pairs are considered for a given lightning event, and thus the range-normalized signal strength of the two sensors observations should give the same value, since the measured radio waves are from the same source current. In other words, if the same event is measured by sensors i and j, then $\tilde{A}_{RNSS_i} = \tilde{A}_{RNSS_j}$. In terms of Equation (3), if sensors i and j each detect a radio wave from the same source, then $$\tilde{A}_{RNSS} = (\tilde{A}_{SS,i} + \tilde{l}_g(d_i)) + C_{0,i} + \overline{C} \cdot \overline{F}(\theta_i) = (\tilde{A}_{SS,j} + \tilde{l}_g(d_j)) + C_{0,j} + \overline{C} \cdot \overline{F}(\theta_j)$$

Subtracting the RNSS expression for sensor j from the RNSS expression for sensor i and rearranging results in Equation (4) below:

$$(\tilde{A}_{SS,j} + \tilde{l}_g(d_j)) - (\tilde{A}_{SS,i} + \tilde{l}_g(d_i)) = C_{0,i} - C_{0,j} + \overline{C} \cdot (\overline{F}(\theta_i) - \overline{F}(\theta_j))$$

The quantities on the left side of Equation (4) are known: the sensor signal strengths are measured, and the geometric spreading equations, expressed as functions of propagation distance, are assumed. The path vector functions $\overline{F}(\theta_i)$ and $\overline{F}(\theta_j)$ are also known and are defined by the terms in the attenuation coefficient vector $\overline{C}$. Writing $\overline{C}=[C_0, C_1, \ldots, C_{M-1}]^T$, where there are M attenuation factors, and $\overline{F}(\theta)=[F_0, F_1, \ldots, F_{M-1}]^T$, the expression on the right hand side of the equality can be expressed as a single dot product, as shown in Equation (5) below:

$$[F_{0,i}-F_{0,j}, F_{1,i}-F_{1,j}, \ldots, F_{M-1,i}-F_{M-1,j}, 0, \ldots, 1, \ldots, -1, \ldots, 0]^T \cdot [C_0, C_1, \ldots, C_{M-1}, C_{0,1}, \ldots, C_{0,i}, \ldots, C_{0,j}, \ldots, C_{0,K-1}]^T$$

where $C_{0,i}$ denotes the calibration factor of the i'th sensor, with K total sensors. Since each equation is expressed as the difference between RNSS calculations from two sensors, there is a constant global calibration factor that can be arbitrarily added to each RNSS expression. This constant global factor is wrapped into the sensor calibration for a single sensor, in this case arbitrarily chosen to be sensor 0. Thus $C_{0,0}$ is omitted from the list of unknowns. This global factor can be determined using an independent reference, such as comparison with a reference LLS or with ground-truth channel base-current data. If one or more (or all) of the sensor calibration factors are already known, they may be omitted from the list of unknowns.

Denoting the modified vectors in Equation (5) as $\bar{F}' \cdot \bar{C}'$, which includes the sensor calibration factors, and writing $(\tilde{A}ss_j + \tilde{I}_g(d_j)) - (\tilde{A}ss_i + \tilde{I}_g(d_i)) \equiv b_{(k)}$, where k indexes the sensor pair sample number, Equation (4) may be expressed compactly as $b_{(k)} = \bar{F}'_{(k)} \cdot \bar{C}'_{(k)}$. With N sensor pairs drawn from a large collection of lightning solutions, the N resulting equations can be expressed as a system of linear equations (Equation (6)):

$$[b_{(0)}, b_{(1)}, \ldots, b_{(N-1)}]^T = [\bar{F}'^T_{(0)}, \bar{F}'^T_{(1)}, \ldots, \bar{F}'^T_{(1)}, \ldots, \bar{F}'^T_{(N-1)}]^T \bar{C}'$$

where the "T" denotes a transpose to convert a row to a column vector, or vice-versa. If there are K sensors in the LLS network, and the vector $\bar{C}$ has length M, then there are up to M+K−1 unknowns: the gain for each of the K sensors, minus the reference sensor, plus the M path attenuation coefficients. With N pairs of observations, Equation (6) defines N linear equations. Assuming the system of equations is sufficiently over-determined, the unknowns $\bar{C}'$ may be solved for using a standard inversion technique, such as a least-squares solver or an iterative algebraic reconstruction technique, potentially with regularization.

Figure 4A:
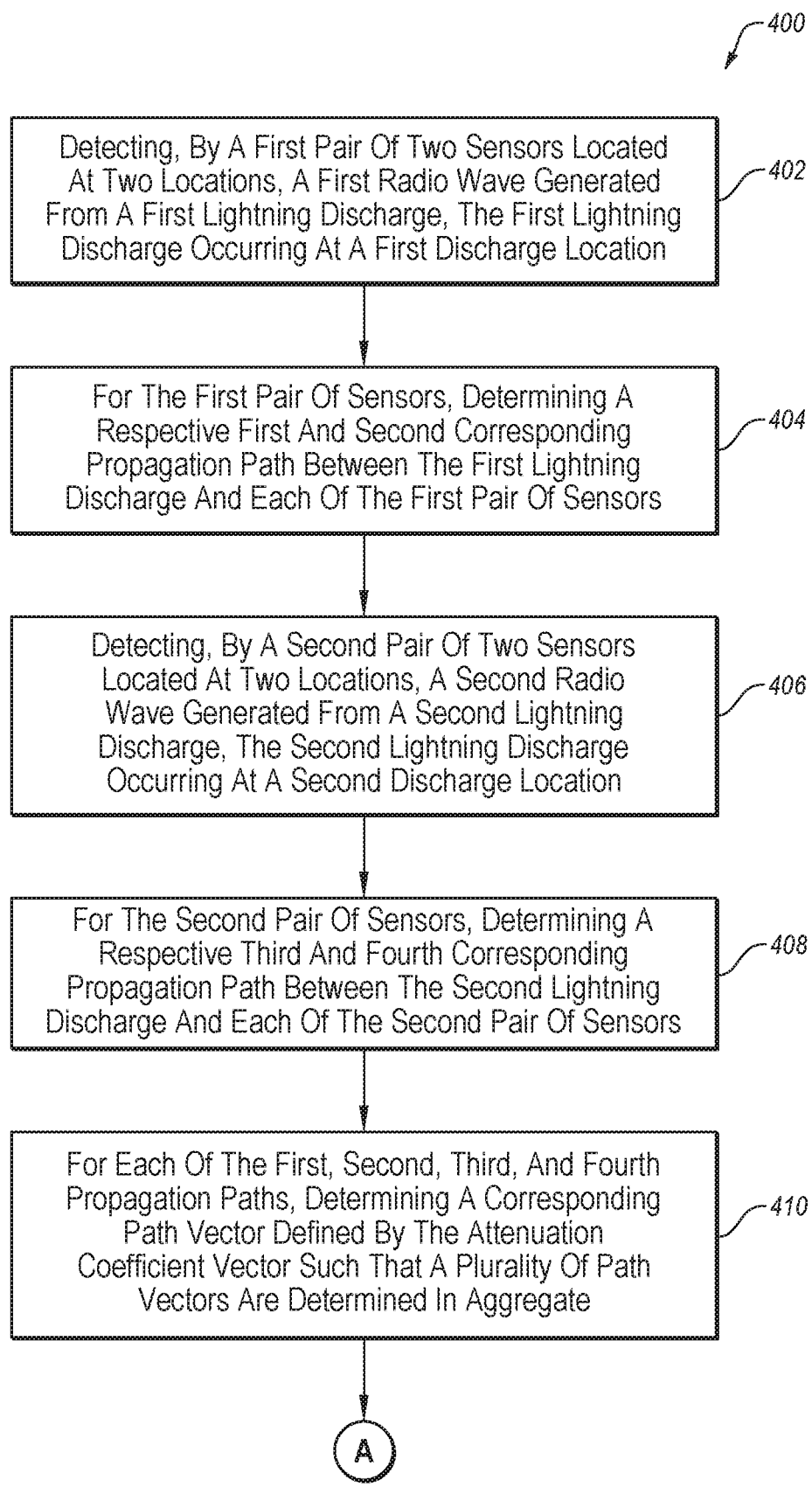
FIGS. 4A and 4B include a flowchart of an example method to empirically determine VLF attenuation factors in the Earth-ionosphere waveguide.
Figure 4B:
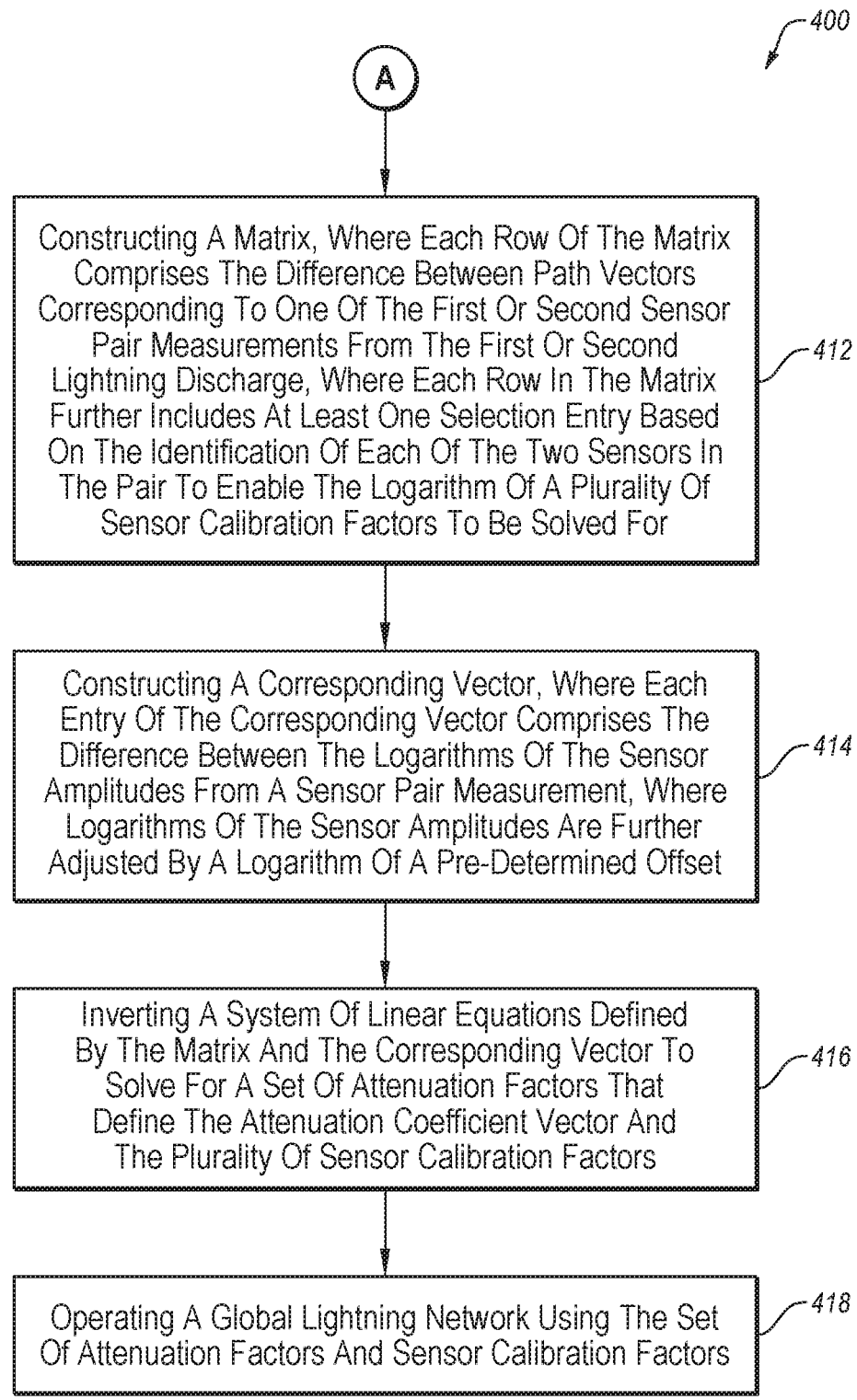

FIGS. 4A and 4B include a flowchart of an example method 400 to empirically determine VLF attenuation factors in the Earth-ionosphere waveguide. The method 400 may be performed, in some embodiments, by a device or system, such as by computational system 500 operating independently or on one of the other described devices. In these and other embodiments, the method 400 may be performed by one or more processors based on one or more computer-readable instructions stored on one or more non-transitory computer-readable media. The method 400 will now be described in connection with FIGS. 1-3.

Method 400 may include, at action 402, detecting, by a first pair of two sensors located at two locations, a first radio wave generated from a first lightning discharge, the first lightning discharge occurring at a first discharge location.

Method 400 may include, at action 404, for the first pair of sensors, determining a respective first and second corresponding propagation path between the first lightning discharge and each of the first pair of sensors.

Method 400 may include, at action 406, detecting, by a second pair of two sensors located at two locations, a second radio wave generated from a second lightning discharge, the second lightning discharge occurring at a second discharge location.

Method 400 may include, at action 408, for the second pair of sensors, determining a respective third and fourth corresponding propagation path between the second lightning discharge and each of the second pair of sensors.

Method 400 may include, at action 410, for each of the first, second, third, and fourth propagation paths, determining a corresponding path vector defined by the attenuation coefficient vector such that a plurality of path vectors are determined in aggregate.

Method 400 may include, at action 412, constructing a matrix, where each row of the matrix comprises the difference between path vectors corresponding to one of the first or second sensor pair measurements from the first or second lightning discharge, where each row in the matrix further includes at least one selection entry based on the identification of each of the two sensors in the pair to enable the logarithm of a plurality of sensor calibration factors to be solved for.

Method 400 may include, at action 414, constructing a corresponding vector, where each entry of the corresponding vector comprises the difference between the logarithms of the sensor amplitudes from a sensor pair measurement, where logarithms of the sensor amplitudes are further adjusted by a logarithm of a pre-determined offset.

Method 400 may include, at action 416, inverting a system of linear equations defined by the matrix and the corresponding vector to solve for a set of attenuation factors that define the attenuation coefficient vector and the plurality of sensor calibration factors.

Method 400 may include, at action 418, operating a global lightning network using the set of attenuation factors and sensor calibration factors.

It is further understood that the method 400 may improve the functioning of a computer system itself.

FIG. 5 includes a block diagram of an example computational system 500 (or processing unit), arranged in accordance with at least one embodiment described herein. The computational system 500 may be used to perform and/or control operation of any of the embodiments described herein. For example, the computational system 500 may be used alone or in conjunction with other components. As another example, the computational system 500 may be used to perform any calculation, solve any equation, perform any identification, and/or make any determination described herein. The computational system 500 is an example implementation of the server 106 of FIG. 1.

The computational system 500 may include any or all of the hardware elements shown in FIG. 5 and described herein. The computational system 500 may include hardware elements that may be electrically coupled via a bus 502 (or may otherwise be in communication, as appropriate). The hardware elements may include one or more processors 504, including one or more general-purpose processors and/or one or more special-purpose processors (such as digital signal processing chips, graphics acceleration chips, and/or other suitable processors); one or more input devices 508, which may include a mouse, a keyboard, or other suitable input device; and one or more output devices 510, which may include a display device, a printer, and/or other suitable output devices.

The computational system 500 may further include (and/or be in communication with) one or more storage devices 506, which may include local and/or network-accessible storage, a disk drive, a drive array, an optical storage device, a solid-state storage device, such as a RAM, and/or ROM, which may be programmable, flash-updateable, and/or the like. The computational system 500 might also include a communication subsystem 512, which may include a modem, a network card (wireless or wired), an infrared communication device, a wireless communication device, and/or chipset (such as a Bluetooth® device, a 802.6 device, a Wi-Fi device, a WiMAX device, cellular communication facilities, etc.), and/or the like. The communication subsystem 512 may permit data to be exchanged with a network (such as the networks described herein) and/or any other systems and/or devices described herein. In many embodiments, the computational system 500 may further include a working memory 514, which may include a RAM or ROM device, as described above.

The computational system 500 may also include software elements, which may be located within the working memory 514. Also, the computational system 500 may include an operating system 516 and/or other code, such as one or more application programs 518, which may include computer programs, and/or may be designed to implement the methods, and/or configure the systems, as described herein. For example, one or more operations or procedures described with respect to the method(s) discussed above might be implemented as code and/or instructions executable by a computer (and/or a processor within a computer). A set of these instructions and/or codes may be stored on a computer-readable storage medium, such as the storage device(s) 506 described above.

In some embodiments, the storage medium may be incorporated within the computational system 500 or in communication with the computational system 500. In other embodiments, the storage medium might be separate from the computational system 500 (e.g., a removable medium, such as a compact disc, etc.), and/or provided in an installation package, such that the storage medium may be used to program a general-purpose computer with instructions/code stored thereon. These instructions may take the form of executable code, which may be executable by the computational system 500 and/or may take the form of source and/or installable code, which, upon compilation and/or installation on the computational system 500 (e.g., using any of a variety of generally available compilers, installation programs, compression/decompression utilities, etc.), takes the form of executable code.

Various embodiments are disclosed herein. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing art to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical, electronic, or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited unless context indicates otherwise. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

The invention claimed is:

1. A method, comprising:
   detecting, by a first pair of two sensors located at two locations, a first radio wave generated from a first lightning discharge, the first lightning discharge occurring at a first discharge location;
   for the first pair of sensors, determining a respective first and second corresponding propagation path between the first lightning discharge and each of the first pair of sensors;
   detecting, by a second pair of two sensors located at two locations, a second radio wave generated from a second lightning discharge, the second lightning discharge occurring at a second discharge location;

for the second pair of sensors, determining a respective third and fourth corresponding propagation path between the second lightning discharge and each of the second pair of sensors;

for each of the first, second, third, and fourth propagation paths, determining a corresponding path vector defined by the attenuation coefficient vector such that a plurality of path vectors are determined in aggregate;

constructing a matrix, where each row of the matrix comprises the difference between path vectors corresponding to one of the first or second sensor pair measurements from the first or second lightning discharge, where each row in the matrix further includes at least one selection entry based on the identification of each of the two sensors in the pair to enable the logarithm of a plurality of sensor calibration factors to be solved for;

constructing a corresponding vector, where each entry of the corresponding vector comprises the difference between the logarithms of the sensor amplitudes from a sensor pair measurement, where logarithms of the sensor amplitudes are further adjusted by a logarithm of a pre-determined offset;

inverting a system of linear equations defined by the matrix and the corresponding vector to solve for a set of attenuation factors that define the attenuation coefficient vector and the plurality of sensor calibration factors; and operating a global lightning network using the set of attenuation factors and sensor calibration factors.

2. The method of claim 1, wherein the pre-determined offset is a range dependent offset.

3. The method of claim 1, wherein the attenuation coefficient vector comprises a set of factors that influence attenuation of the first radio wave or second radio wave.

4. The method of claim 3, where the set of factors are defined in terms of an amount of attenuation in decibels.

5. The method of claim 4, wherein the set of factors is expressed in terms of attenuation per unit of propagation distance of a portion of a whole of the first, second, third, or fourth propagation path where each of the set of factors is relevant.

6. The method of claim 4, wherein the set of factors is expressed as a constant attenuation factor applied to a whole of at least one of the first, second, third, or fourth propagation paths.

7. The method of claim 3, wherein the set of factors that influence attenuation of the radio wave include a time of day, a location, a direction of propagation of the radio wave with respect to the Earth's magnetic field, an inclination of the Earth's magnetic field, ground conductivity, an ionospheric reflection number and reflection angle, distance between the first or second discharge location and one of the sensors of the first pair or second pair of sensors, elevation of the sun during the daytime, day and night terminator crossings, land and sea crossings, or a combination thereof.

8. The method of claim 1, wherein each of the plurality of path vectors is based on the radio wave propagating through the Earth-ionosphere waveguide.

9. The method of claim 1, wherein operating the global lightning network further comprises:

calculating a peak-current amplitude of the lightning discharge based on one or more range-normalized signal strengths (RNSSs).

10. The method of claim 1, further comprising:
during operation of the global lightning network, determining a range-normalized signal strength (RNSS), measured in dB, for each sensor of the first sensor pair and the second sensor pair, wherein determining the RNSS is based on a sum of the logarithm of the sensor amplitude, the logarithm of the sensor calibration factor, the logarithm of the offset factor, and an additional attenuation factor.

11. The method of claim 10, wherein the additional attenuation factor is based on the path vector defined by the attenuation coefficient vector, where the entries in the path vector and the attenuation coefficient vector are multiplied and summed.

12. The method of claim 1, wherein determining each of the first, second, third, or fourth propagation paths further comprises:
determining the great-circle path from the discharge location to each of the plurality of sensors.

13. The method of claim 1, wherein determining each of the first, second, third, or fourth propagation paths further comprises:
determining each entry into each of the path vectors based on the definition of the attenuation coefficient vector.

14. The method of claim 1, wherein the first radio wave and the second radio wave have a frequency in a range inclusive of 3 to 30 kilohertz (kHz).

15. The method of claim 1, the first lightning discharge and the second lightning discharge being the same lightning discharge.

16. One or more non-transitory computer-readable media comprising one or more computer readable instructions that, when executed by one or more processors of a computing device, cause the computing device to perform a method comprising:

detecting, by a first pair of two sensors located at two locations, a first radio wave generated from a first lightning discharge, the first lightning discharge occurring at a first discharge location;

for the first pair of sensors, determining a respective first and second corresponding propagation path between the first lightning discharge and each of the first pair of sensors;

detecting, by a second pair of two sensors located at two locations, a second radio wave generated from a second lightning discharge, the second lightning discharge occurring at a second discharge location;

for the second pair of sensors, determining a respective third and fourth corresponding propagation path between the second lightning discharge and each of the second pair of sensors;

for each of the first, second, third, and fourth propagation paths, determining a corresponding path vector defined by the attenuation coefficient vector such that a plurality of path vectors are determined in aggregate;

constructing a matrix, where each row of the matrix comprises the difference between path vectors corresponding to one of the first or second sensor pair measurements from the first or second lightning discharge, where each row in the matrix further includes at least one selection entry based on the identification of each of the two sensors in the pair to enable the logarithm of a plurality of sensor calibration factors to be solved for;

constructing a corresponding vector, where each entry of the corresponding vector comprises the difference between the logarithms of the sensor amplitudes from a sensor pair measurement, where logarithms of the sensor amplitudes are further adjusted by a logarithm of a pre-determined offset;

inverting a system of linear equations defined by the matrix and the corresponding vector to solve for a set of attenuation factors that define the attenuation coefficient vector and the plurality of sensor calibration factors; and operating a global lightning network using the set of attenuation factors and sensor calibration factors.

17. The non-transitory computer-readable media of claim 16, wherein the attenuation coefficient vector comprises a set of factors that influence attenuation of the first radio wave or the second radio wave.

18. The non-transitory computer-readable media of claim 17, where the set of factors are defined in terms of an amount of attenuation in decibels.

19. The non-transitory computer-readable media of claim 18, wherein the set of factors is expressed in terms of attenuation per unit of propagation distance of a portion of a whole of the first, second, third, or fourth propagation path where each of the set of factors is relevant.

20. An apparatus comprising:
a processor;
memory in electronic communication with the processor; and
instructions stored in the memory, the instructions being executable by the processor to:
 detecting, by a first pair of two sensors located at two locations, a first radio wave generated from a first lightning discharge, the first lightning discharge occurring at a first discharge location;
 for the first pair of sensors, determining a respective first and second corresponding propagation path vectors between the first lightning discharge and each of the first pair of sensors;
 detecting, by a second pair of two sensors located at two locations, a second radio wave generated from a second lightning discharge, the second lightning discharge occurring at a second discharge location;
 for the second pair of sensors, determining a respective third and fourth corresponding propagation path vectors between the second lightning discharge and each of the second pair of sensors;
 for each of the first, second, third, and fourth propagation path vectors, determining a corresponding path vector defined by the attenuation coefficient vector such that a plurality of path vectors are determined in aggregate;
 constructing a matrix, where each row of the matrix comprises the difference between path vectors corresponding to one of the first or second sensor pair measurements from the first or second lightning discharge, where each row in the matrix further includes at least one selection entry based on the identification of each of the two sensors in the pair to enable the logarithm of a plurality of sensor calibration factors to be solved for;
 constructing a corresponding vector, where each entry of the corresponding vector comprises the difference between the logarithms of the sensor amplitudes from a sensor pair measurement, where logarithms of the sensor amplitudes are further adjusted by a logarithm of a pre-determined offset;
 inverting a system of linear equations defined by the matrix and the corresponding vector to solve for a set of attenuation factors that define the attenuation coefficient vector and the plurality of sensor calibration factors; and
 operating a global lightning network using the set of attenuation factors and sensor calibration factors.

* * * * *